US012685034B2

(12) United States Patent (10) Patent No.: US 12,685,034 B2
Wu et al. (45) Date of Patent: Jul. 14, 2026

(54) ATOMICALLY TUNED ULTRATHIN MEMRISTORS

(71) Applicant: University of Kansas, Lawrence, KS (US)

(72) Inventors: Judy Z. Wu, Lawrence, KS (US); Ryan W. Goul, Topeka, KS (US)

(73) Assignee: University of Kansas, Lawrence, KS (US)

( * ) Notice: Subject to any disclaimer, the term of this patent is extended or adjusted under 35 U.S.C. 154(b) by 479 days.

(21) Appl. No.: 18/280,305

(22) PCT Filed: May 31, 2022

(86) PCT No.: PCT/US2022/072644
§ 371 (c)(1),
(2) Date: Sep. 5, 2023

(87) PCT Pub. No.: WO2022/256790
PCT Pub. Date: Dec. 8, 2022

(65) Prior Publication Data
US 2024/0074332 A1     Feb. 29, 2024

Related U.S. Application Data

(60) Provisional application No. 63/195,952, filed on Jun. 2, 2021.

(51) Int. Cl.
*H10N 70/00* (2023.01)
*H10B 63/00* (2023.01)
*H10N 70/20* (2023.01)

(52) U.S. Cl.
CPC ........... *H10N 70/023* (2023.02); *H10B 63/00* (2023.02); *H10B 63/80* (2023.02); *H10N 70/041* (2023.02);
(Continued)

(58) Field of Classification Search
CPC .... H10N 70/24; H10N 70/826; H10N 70/841; H10N 70/8833
See application file for complete search history.

(56) References Cited

U.S. PATENT DOCUMENTS

2016/0040288 A1     2/2016   Wu et al.
2017/0005262 A1     1/2017   Hwang et al.
(Continued)

FOREIGN PATENT DOCUMENTS

CN          210325807 U      4/2020

OTHER PUBLICATIONS

Xing Li et al., "Atomic Layer Deposition of Ga2O3/ZnO Composite Films for High-Performance Forming-Free Resistive Switching Memory," *ACS Appl. Mater. Interfaces*, 2020, 12, 30538-30547.
(Continued)

*Primary Examiner* — Mark V Prenty
(74) *Attorney, Agent, or Firm* — Bell & Manning, LLC

(57) ABSTRACT

Memristors are provided, which, in embodiments, comprise a bottom electrode; a top electrode in electrical communication with the bottom electrode, wherein one or both of the bottom and top electrodes is a Schottky electrode; and a dielectric stack between the bottom and top electrodes, the dielectric stack forming a top interface with a bottom surface of the top electrode and a bottom interface with a top surface of the bottom electrode, the dielectric stack comprising a plurality of atomic layer deposition (ALD)-grown atomic sublayers, the plurality comprising an ALD-grown atomic sublayer of a first metal oxide and an ALD-grown atomic sublayer of a second metal oxide. The second metal oxide is different from the first metal oxide and has a greater concentration of oxygen vacancies ($V_O$) than the first metal oxide. The dielectric stack has a thickness of no more than about 5 nm.

20 Claims, 11 Drawing Sheets

Atomically Controlled $V_O$ Doping

(52) U.S. Cl.

CPC ........... *H10N 70/24* (2023.02); *H10N 70/841* (2023.02); *H10N 70/8833* (2023.02)

(56) References Cited

U.S. PATENT DOCUMENTS

2019/0013463 A1    1/2019    Wu et al.
2024/0074332 A1*   2/2024    Wu ..................... G11C 13/0007

OTHER PUBLICATIONS

Ryan Goul et al., "Investigation of In Vacuo Atomic Layer Deposition of Ultrathin MgAl2O4 Using Scanning Tunneling Spectroscopy," *ACS Appl. Electron. Mater.* 2020, 2, 3121-3130.

Jagaran Acharya et al., Effect of Al2O3 Seed-Layer on the Dielectric and Electrical Properties of Ultrathin MgO Films Fabricated Using In Situ Atomic Layer Deposition,"*ACS Appl. Mater. Interfaces* 2019, 11, 30368-30375."

Sujaya Kumar Vishwanath et al., Enhancement of resistive switching properties in Al2O3 bilayer-based atomic switches: multilevel resistive switching, 2018 *Nanotechnology* 29 235202.

The International Search Report and Written Opinion issued on Aug. 17, 2022 for international patent application No. PCT/US2022/072644; pp. 1-11.

Chao Du et al., "Biorealistic Implementation of Synaptic Functions with Oxide Memristors through Internal Ionic Dynamics," *Advanced Functional Materials* 2015, 25, 4290-4299.

Hojeong Ryu et al., "Gradually Tunable Conductance in TiO2/Al2O3 Bilayer Resistors for Synaptic Device," *Metals* 2021, 11, 440. https://doi.org/10.3390/metl103.

Chunxiang Zhu et al., "Atomic Layer Deposited High-K Films and Their Role in Metal-Insulator-Metal Capacitors for Si RF/Analog Integrated Circuit Applications," *Chemical Vapor Deposition* 2006, 12, 165-171.

* cited by examiner

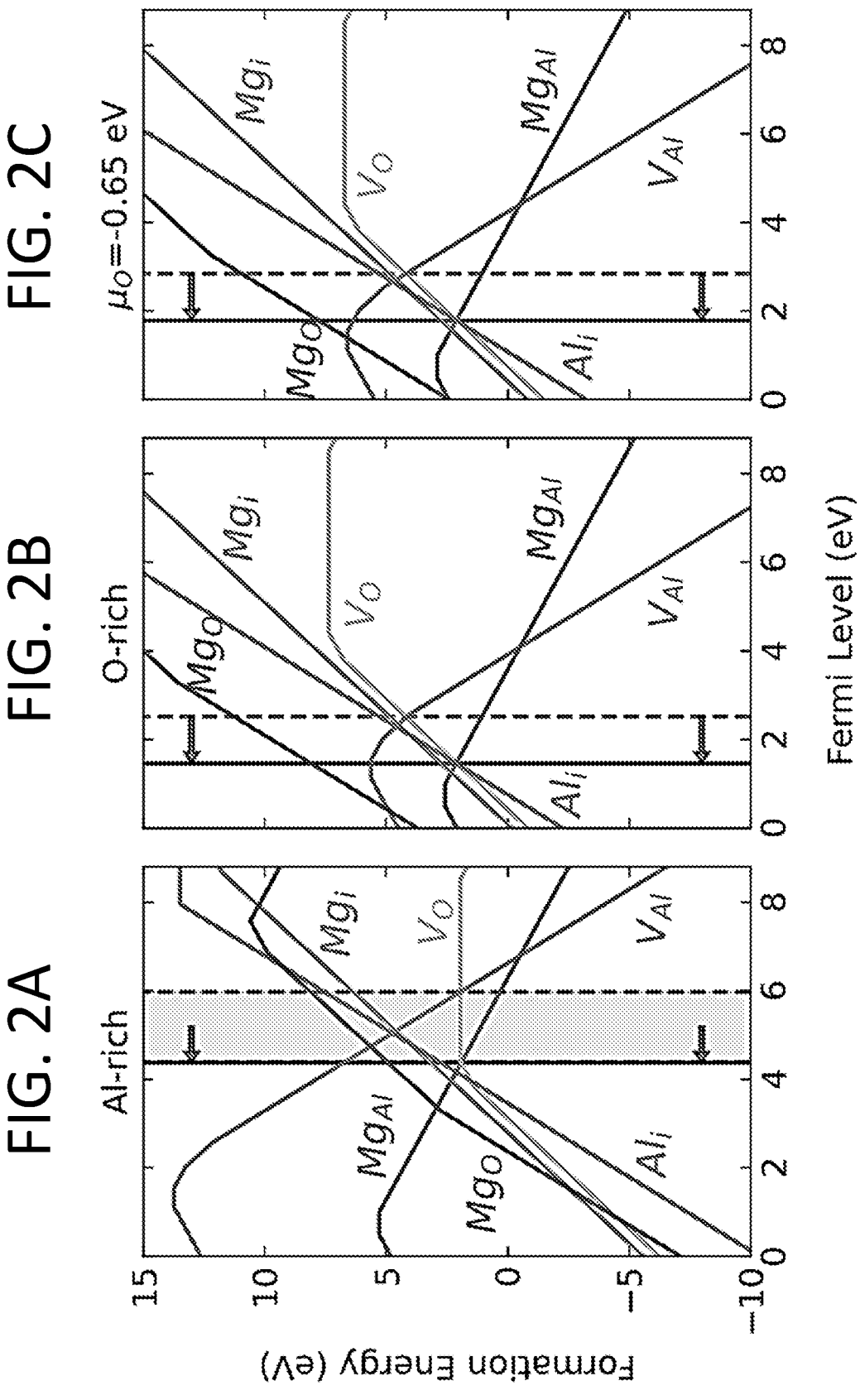

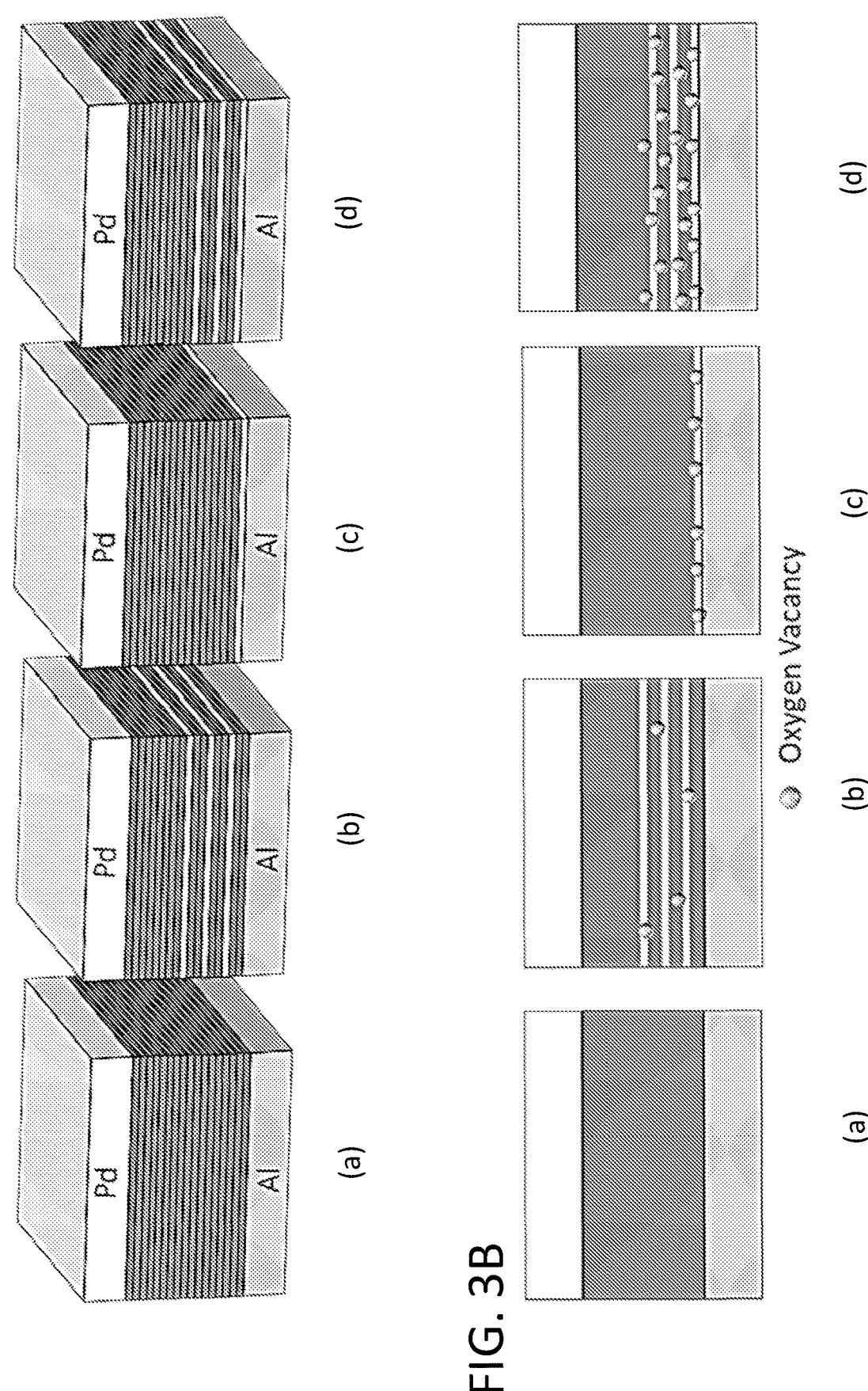

ATOMICALLY TUNED ULTRATHIN MEMRISTORS

CROSS-REFERENCE TO RELATED APPLICATIONS

The present application is a National Stage of International Application No. PCT/US22/72644, filed May 31, 2022, which claims priority to U.S. provisional patent application No. 63/195,952 that was filed Jun. 2, 2021, the entire contents of both of which are incorporated herein by reference.

REFERENCE TO GOVERNMENT RIGHTS

This invention was made with government support under 1809293 and 1909292 awarded by the National Science Foundation. The government has certain rights in the invention.

BACKGROUND

Interest in neuromorphic computing has been steadily increasing in recent years, due to its potential to circumvent the Von Neumann bottleneck which arises from the extra energy and time required to transport data between memory and processor units during computation. Spearheaded by improvements in resistive random access memory (RRAM) utilizing memristors, researchers have attempted to mimic biological neuron and synapse operation by using artificial versions of these elements, known as memristors. In the memristors, the operations of both non-volatile memory storage and low-power computing are integrated in one device, taking advantage of the computing strengths of a neural system, namely pattern recognition and unstructured data sorting. Considering neuromorphic computing relies on a larger array of memristors, the performance of memristors becomes critically important to the success of neuromorphic computing.

Memristors, regarded as the fourth fundamental circuit element next to the resistor, capacitor, and inductor, are usually two-terminal devices made up of two electrodes sandwiching an insulator, featuring a pinched hysteresis of resistance. Most commonly, memristors are found in the form of a resistive switching layer made up of one or two metal oxides, forming a thin dielectric film between a pair of Schottky electrodes, or a Schottky and Ohmic electrode, to mimic the functionality of artificial neurons/synapses. Resistance hysteresis is realized through the bipolar switching of two different serially connected resistors or a double-layer dielectric film between which the carriers such as oxygen vacancies can be driven back and forth if the dielectric film can be well controlled at nanometer scales. In most metal-oxide barrier memristors, a filamentary switching mechanism is observed in which a positive bias on the ohmic contact creates an electric field that in conjunction with joule heating in some cases causes oxygen vacancies from the vacancy rich layer to diffuse through the higher quality dielectric layer and form a nanoscale conductive filament, setting the memristor to the low resistance state (LRS). The opposite effect occurs when applying a negative voltage and the conductive filament is ruptured through oxygen vacancy diffusion and the memristor is reset to the high resistance state (HRS).

SUMMARY

Provided are memristors and devices comprising the same. The present approach to memristor design involves using in vacuo atomic layer deposition (ALD) to form an ultrathin dielectric stack (e.g., less than about 5 nm) of atomically thin (about 0.1 nm) sublayers of two different types of metal oxides. This allows for precise (atomically precise) positioning of metal atoms and oxygen vacancies within the dielectric stack. The number and ordering of the atomically thin sublayers affect the electronic structure of the dielectric stack and these parameters may be selected so that the memristor exhibits any desired set of properties (e.g., high resistance state (HRS), on/off ratio, total barrier height $E_T$, switching times, device yield, etc.). Using the present approach, ultrathin memristors have been formed which exhibit unexpectedly high values for each of these properties despite the thinness of the memristors, e.g., on/off ratios of $10^4$ for a dielectric stack of less than about 3 nm. In addition, due to the tunable nature of the present approach, other ultrathin memristors have been formed so as to span a wide range of values of these properties, e.g., HRS, on/off ratios, and switching times that span orders of magnitude, e.g., three orders of magnitude.

In embodiments, a memristor comprises a bottom electrode; a top electrode in electrical communication with the bottom electrode, wherein one or both of the bottom and top electrodes is a Schottky electrode; and a dielectric stack between the bottom and top electrodes, the dielectric stack forming a top interface with a bottom surface of the top electrode and a bottom interface with a top surface of the bottom electrode, the dielectric stack comprising a plurality of atomic layer deposition (ALD)-grown atomic sublayers, the plurality comprising an ALD-grown atomic sublayer of a first metal oxide and an ALD-grown atomic sublayer of a second metal oxide, wherein the second metal oxide is different from the first metal oxide and has a greater concentration of oxygen vacancies ($V_O$) than the first metal oxide, wherein the dielectric stack has a thickness of no more than about 5 nm.

Other principal features and advantages of the disclosure will become apparent to those skilled in the art upon review of the following drawings, the detailed description, and the appended claims.

BRIEF DESCRIPTION OF THE DRAWINGS

Illustrative embodiments of the disclosure will hereafter be described with reference to the accompanying drawings.

FIG. 1A shows hypothetical distribution of oxygen vacancies and other defects in the M1/M2 stack of a conventional memristor, and FIG. 1B shows the atomically controlled $V_O$ doping from a pristine insulating oxide to allow tunable permissive switching in ultrathin memristors.

FIGS. 2A-2C show the defect formation energy as function of the Fermi level for native and Mg-related defects in $Al_2O_3$ for chemical potentials corresponding to (FIG. 2A) Al-rich, (FIG. 2B) O-rich, and (FIG. 2C) an oxygen chemical potential of −0.65 eV (to mimic ALD growth conditions).

FIG. 3A, panels (a)-(d), shows diagrams of ALD memristors having a total of 17 C in M1/M2 stacks. These memristors are comprised of: (FIG. 3A, panel (a)) 17 $Al_2O_3$ atomic layers, (FIG. 3A, panel (b)) 3 MgO atomic layers in the M1 at the $3^{rd}$, $6^{th}$ and $9^{th}$ position from Al electrode at the bottom, (FIG. 3A, panel (c)) one MgO layer as the M2 layer in the $1^{st}$ position above Al electrode, and (FIG. 3A, panel (d)) 3 MgO layers at the $1^{st}$, $4^{th}$, and $7^{th}$ position, with the first one serving as the M2. FIG. 3B, panels (a)-(d), shows diagrams of the expected $V_O$ distribution.

DETAILED DESCRIPTION

Figure 7:
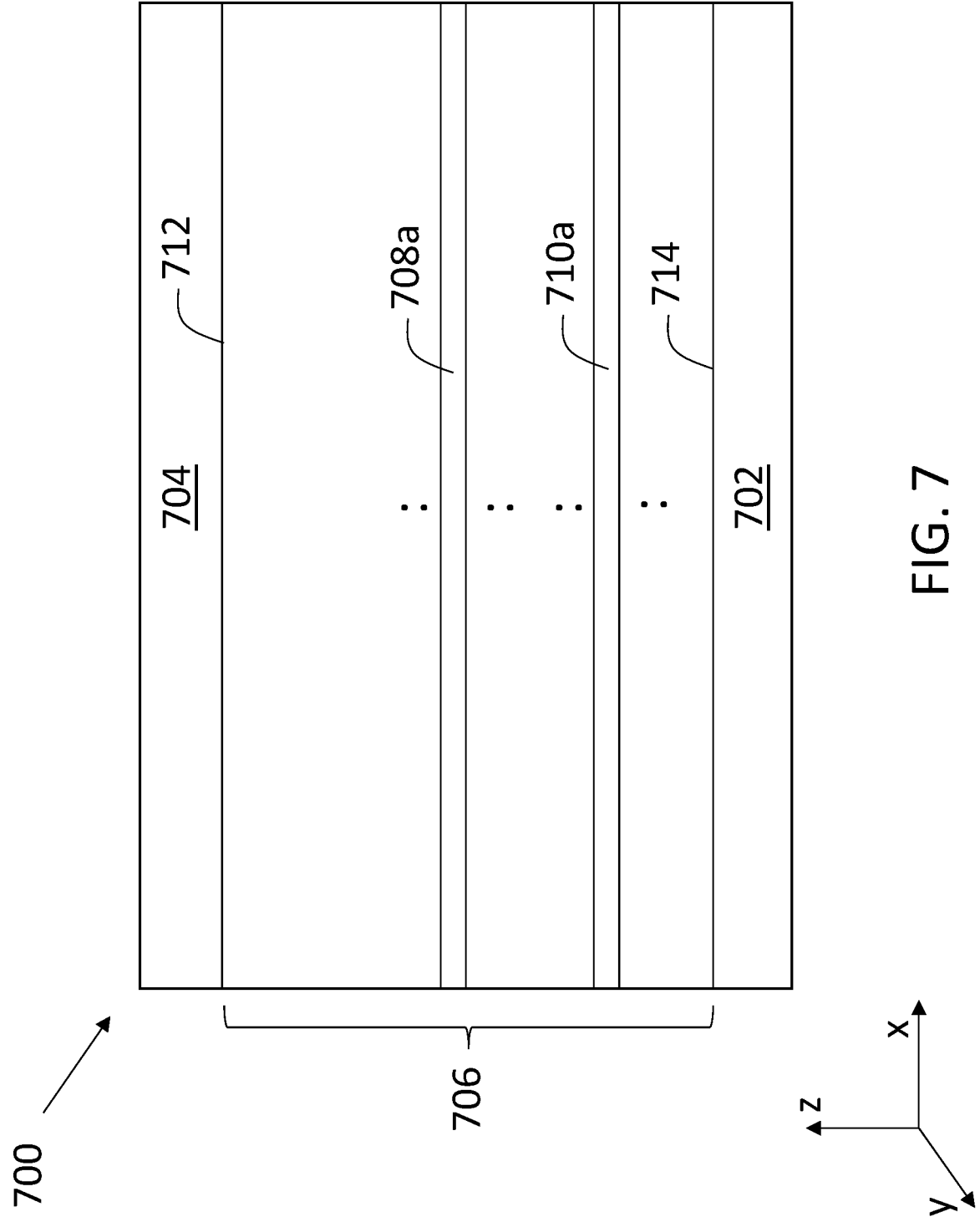
FIG. 7 depicts a schematic of a cross-section of a memristor according to an illustrative embodiment.

Memristors are provided. With reference to FIG. 7, a cross-section of an illustrative memristor 700 is shown which comprises (and in embodiments, consists of) a bottom electrode 702, a top electrode 704 (oppositely facing the bottom electrode 702), and a dielectric stack 706 between the top and bottom electrodes 704, 702. The dielectric stack 706 comprises (and in embodiments, consists of) a plurality of ALD-grown atomic sublayers. The plurality of ALD-grown atomic sublayers comprises one or more ALD-grown atomic sublayers of a first metal oxide (one of which is labeled 708a) and one or more ALD-grown atomic sublayers of a second metal oxide (one of which is labeled 710a). A top interface 712 is formed between a bottom surface of the top electrode 704 and a top surface of an uppermost ALD-grown atomic sublayer in the dielectric stack 706. This means the top electrode 704 and the uppermost ALD-grown atomic sublayer are in direct contact. A bottom interface 714 is formed between a top surface of the bottom electrode 702 and a bottom surface of a bottommost ALD-grown atomic sublayer of the dielectric stack 706. This means the bottom electrode 702 and the bottommost ALD-grown atomic sublayer are in direct contact. The ":" symbols in FIG. 7 are used to indicate that there may be (and generally are) other ALD-grown atomic sublayers in the dielectric stack (i.e., more than two). The other ALD-grown atomic sublayers of the plurality of ALD-grown atomic sublayers are sandwiched together to form the dielectric stack 706. In embodiments, the memristor 700 consists of the top and bottom electrodes 704, 702 and the dielectric stack 706 of the ALD-grown atomic sublayers (the number and ordering of which may vary as described below) of the first and second metal oxides (708a, 710a).

An axis is included in FIG. 7 for reference. The cross-section of the memristor 700 is taken along the xz plane; lateral dimensions of the ALD-grown atomic sublayers are taken along the xy plane; the thicknesses of individual ALD-grown atomic sublayers (e.g., 708a, 710a) and the thickness of the dielectric stack 706 are taken along the z axis, perpendicular to the plane defined by the ALD-grown atomic sublayers (e.g., 708a, 710a)/dielectric stack 706.

By "ALD-grown" it is meant that the referenced layer has been grown via atomic layer deposition (ALD). The phrase "atomic sublayers" is used since individual sublayers have a thickness corresponding to the diameter of the atoms making up the relevant metal oxide. This thickness is generally about 0.1 nm, which includes a thickness of 0.1 nm±10%. That is, an individual ALD-grown atomic sublayer has a thickness of about 0.1 nm, which includes a thickness of 0.1 nm±10%. Thicknesses of the ALD-grown sublayers may be determined with reference to the growth rates and cycles being used during the ALD process. Ellipsometry may be used to determine the growth rate for a particular metal oxide, e.g., the growth rate for $Al_2O_3$ is 0.11 to 0.12 nm/cycle.

A variety of metal oxides may be used for the first and second metal oxides that form the ALD-grown atomic sublayers (e.g., 708a, 710a) of the dielectric stack 706. For example, the first and second metal oxides may be selected from aluminum oxide ($Al_2O_3$), gallium oxide ($Ga_2O_3$), magnesium oxide (MgO), calcium oxide (CaO), beryllium oxide (BeO), cadmium oxide (e.g., CdO), zinc oxide (ZnO), and hafnium oxide ($HfO_2$). However, the first and second metal oxides that are selected (which may be referred to as a "pair") are different metal oxides from one another, i.e., different chemical compounds comprising at least one different chemical element (e.g., different metals). In addition, the first and second metal oxides of the pair are different from one another in terms of their concentration of oxygen vacancies ($V_O$). Specifically, the pair is selected so that one of the first and second metal oxides has a greater concentration of $V_O$ than the other. The metal oxide having the greater concentration of $V_O$ may be referred to as a "poor" oxide while the metal oxide having the smaller concentration of $V_O$ may be referred to as a "good" oxide. The relative $V_O$ concentration of two different oxides (e.g., poor and good oxides) may be quantified by reference to the resistivity (conductivity) or dielectric constant (capacitance) of the two different oxides. The poor oxide, having a greater concentration of $V_O$, may be characterized by a lower resistance (higher conductivity) than the good oxide, e.g., at least an order of magnitude lower resistance (higher conductivity) to three orders of magnitude lower resistance (higher conductivity). The poor oxide, having a greater concentration of $V_O$, may be characterized by a lower dielectric constant (lower capacitance) than the good oxide, e.g., at least three times lower dielectric constant (lower capacitance) to an order of magnitude lower dielectric constant (lower capacitance). These comparisons refer to the two oxides having been formed by the same technique (e.g., one to a few cycles of ALD using the technique and conditions descried herein) and measured using the same measurement technique. Techniques for measuring resistance (capacitance) are known, including Liu et al, Advanced Materials Interfaces, 2017 Vol. 4, Page 1601064.

Techniques for measuring dielectric constant (capacitance) are known, including Achaya et al, ACS Applied Materials and Interfaces vol. 10, page 3112.

Desirably, the pair is also selected such that one of the first and second metal oxides (the poor metal oxide) lowers the Fermi energy of the other of the first and second metal oxides (good metal oxide), thereby increasing the resistance of the good metal oxide. In addition, the pair is desirably selected such that the poor metal oxide lowers the $V_O$ formation energy in the good metal oxide, i.e., the energy required to form $V_O$ in the good metal oxide. Although it is not possible to predict pairs of first and second metal oxides which possess these features based on their valence states, the pairs may be determined using theoretical calculations as described in the Example, below. As also described in the Example, below, such calculations were used to discover that MgO, a poor metal oxide relative to $Al_2O_3$, unexpectedly lowers the Fermi energy and $V_O$ formation energy of $Al_2O_3$. This finding has also been experimentally confirmed, below. Thus, in embodiments, the first and second metal oxides used to form the ALD-grown atomic sublayers (e.g., 708a, 710a) of the dielectric stack 706 are $Al_2O_3$ and MgO. In embodiments, the first and second metal oxides are $Ga_2O_3$ and MgO, respectively.

In embodiments, the dielectric stack 706 of the memristor 700 includes one or more ALD grown atomic sublayers of a third metal oxide. The third metal oxide is a different chemical compound comprising at least one different chemical element (e.g., a different metal) from the first and second metal oxides. In embodiments, the first, second, and third metal oxides are $Al_2O_3$, MgO, and $Ga_2O_3$, respectively.

Various conductive materials may be used to form the top and bottom electrodes 704, 702. In embodiments, one of the top and bottom electrodes 704, 702 is an Ohmic electrode, i.e., one that forms an Ohmic contact at either the top interface 712 or the bottom interface 714, while the other of the top and bottom electrodes 704, 702 is a Schottky electrode, i.e., one that forms a Schottky contact at the other of the top interface 712 or the bottom interface 714. In embodiments, both of the top and bottom electrodes 704, 702 are Schottky electrodes. Illustrative conductive materials to form Ohmic electrodes include Al, Ti, W, and Ta. Illustrative conductive materials to form Schottky electrodes include Pd, Pt, Ag. The present memristors are distinguished from other electrical components such as capacitors that include two Ohmic electrodes, i.e., top and bottom electrodes that are Ohmic electrodes. Memristors also exhibit two distinct resistance states, a high resistance state (exhibiting a relatively higher resistance to conduction through the dielectric stack) and a low resistance state (exhibiting a relatively lower resistance to conduction through the dielectric stack) as well as the ability to switch between these two resistances states. Moreover, the resistance exhibited by the memristor varies depending upon the previous electrical charge that has flowed through the memristor. Electrical components that do not exhibit these characteristics cannot be considered to be memristors.

The present approach to memristor design allows for significant flexibility in terms of the particular number of ALD-grown atomic sublayers of the first metal oxide in the dielectric stack 706, the particular number of ALD-grown atomic sublayers of the second metal oxide in the dielectric stack 706, the total number of ALD-grown atomic sublayers in the dielectric stack 706, and the particular ordering of the ALD-grown atomic sublayers in the dielectric stack 706. Each of these parameters affects the electronic structure of the dielectric stack 706 and thus, the properties of the memristor 700. These parameters may be adjusted to achieve a desired value of HRS, on/off ratio, $E_T$, switching speed, device yield, and combinations thereof. As such, the present approach affords an unprecedented degree of tunability in terms of memristor properties and performance.

Referring back to the memristor 700 of FIG. 7, the total number of ALD-grown atomic sublayers is generally selected so that the thickness of the dielectric stack 706 is not more than about 5 nm (which includes 5 nm±10%), not more than about 4 nm (which includes 4 nm±10%), not more than about 3 nm (which includes 3 nm±10%), or not more than about no more than about 2 nm (which includes 2 nm±10%). Thicknesses of the dielectric stack 706 may be determined as described above with respect to the individual ALD-grown atomic sublayers. Thus, the present memristors may be described as being "ultrathin."

By contrast, conventional memristors are significantly thicker (e.g., greater than 10 nm). This is because conventional memristors include a variety of defects (other than the desired oxygen vacancies) such as those shown in FIG. 1A. these include defects generated upon exposure of the memristor to air as the material layers thereof are being formed as well as the inherent difficulty in growing oxides on metals such as Pt, Pd, Au via ALD due to the formation of a defective nucleation layer at the metal surface. Due to such defects, the dielectric layer or bilayer of conventional memristors must be made sufficiently thick so as to minimize the negative impact of the defects on memristor performance (e.g., shorts from electrical leakage). Electrical leakage (and inability to form a memresistive switch) is evidenced by current flowing upon application of a bias voltage that increases as bias voltage increases.

Figures 5A, 5B, 5C, 5D:
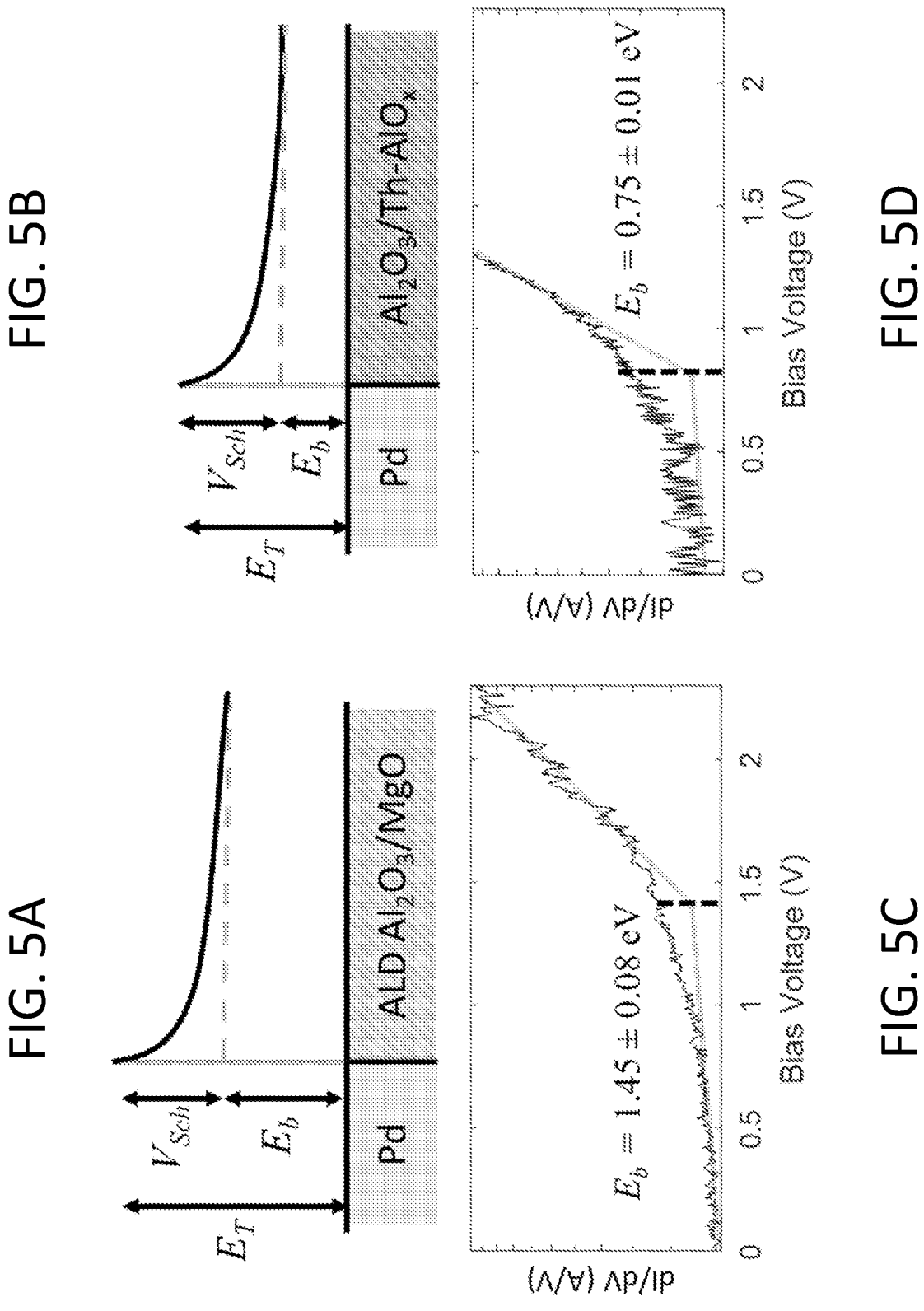
FIGS. 5A-5B show hypothetical barrier energy diagrams at the Pd Schottky interface for (FIG. 5A) an $MgO/Al_2O_3$ memristor, and (FIG. 5B) an $Al_2O_3/Th$—$AlO_x$ memristor.
FIGS. 5C-5D show representative STS dI/dV spectra of (FIG. 5C) 9 C $MgO/Al_2O_3$ mix grown without an IL (Average $E_b$=1.45±0.08 eV) (FIG. 5D) 10 C $Al_2O_3$ grown with an IL (Average $E_b$=0.75±0.01 eV).
Figures 5E, 5F:
FIG. 5E shows a comparison of memristor HRS/LRS values for memristors with M2 layers composed of ALD-MgO or Th—AlOx.
(FIG. 5F shows log (RA) fitting used to find total barrier height $E_T$ for memristors with the two different M2 layers.

The present memristors do not suffer from such defects. The lack of such defects in the present memristors is experimentally confirmed by the memristors exhibiting memresistive switching as well as high HRS, high on/off ratios, and high device yields despite the relative thinness of the dielectric stack 706. For example, FIG. 5E plots the HRS and LRS values as a function of dielectric stack thickness (total M1/M2 thickness) for illustrative memristors consisting of a dielectric stack of ALD-grown atomic sublayers of MgO and $Al_2O_3$ between top and bottom electrodes. Even the memristor having a dielectric stack thickness of only 1.21 nm exhibits an on/off ratio of greater than 10. This is believed to be the thinnest ALD-based memristor ever reported.

Figures 3C, 3D:
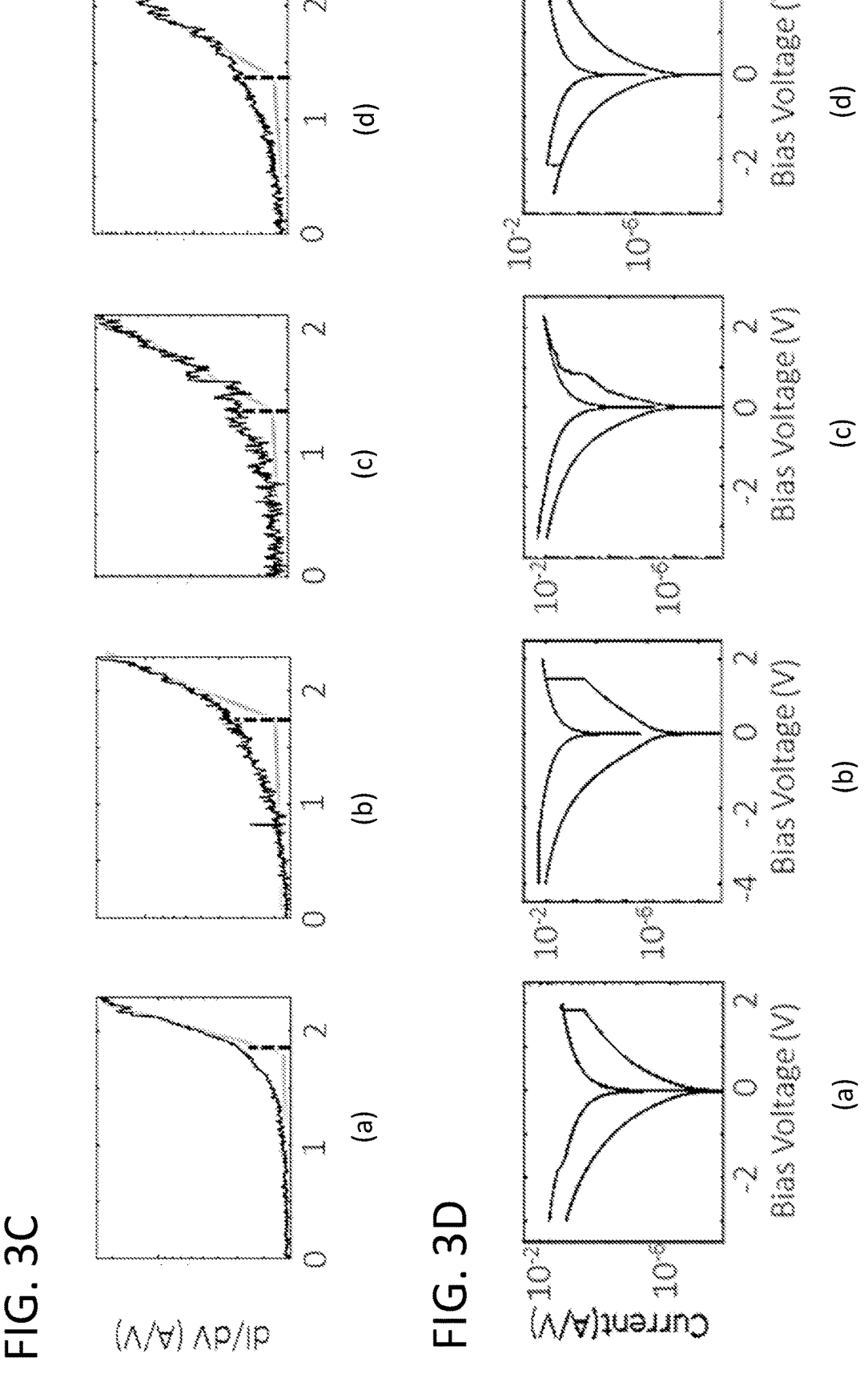
FIG. 3C, panels (a)-(d), shows representative STS dI/dV curves in log scale to demonstrate local density of states in the samples shown in panels (a)-(d) of FIG. 3A.
FIG. 3D, panels (a)-(d), shows characteristic memristor I-V curves of each of the samples shown in panels (a)-(d) of FIG. 3A, showing either early failure (panels (a) and (b)) or consistent performance.
Figures 4A, 4B, 4C, 4D:
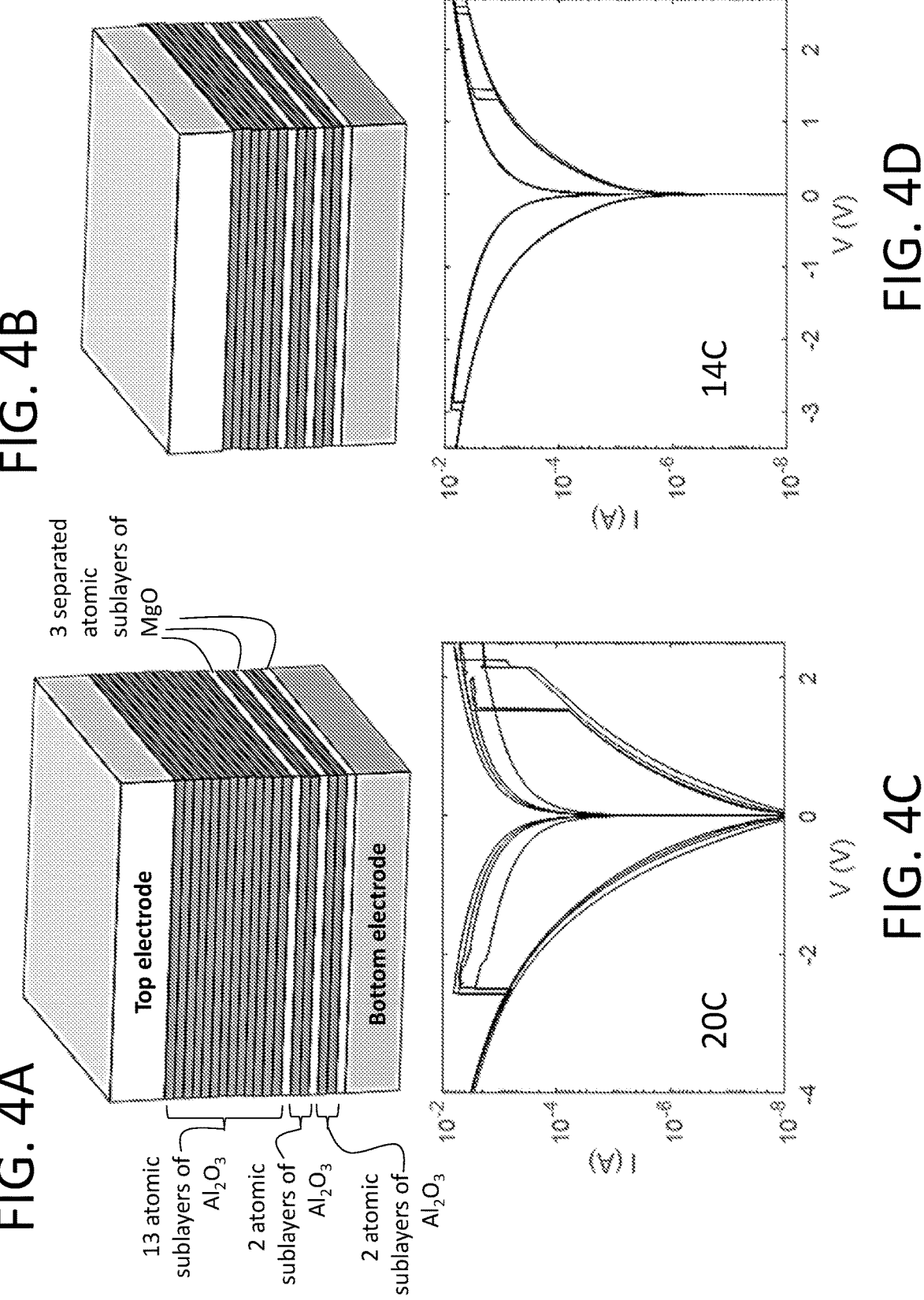
FIGS. 4A-4B show diagrams of memristors with an M2 layer of 1 C MgO (~0.11 nm thick) structure with total M1/M2 layer thickness of (FIG. 4A) 20 C, and (FIG. 4B) 14 C, respectively.
FIGS. 4C-4D show five repeated IV sweeps of (FIG. 4C) the 20 C, and (FIG. 4D) the 14 C memristor.
Figures 6A, 6B, 6C:
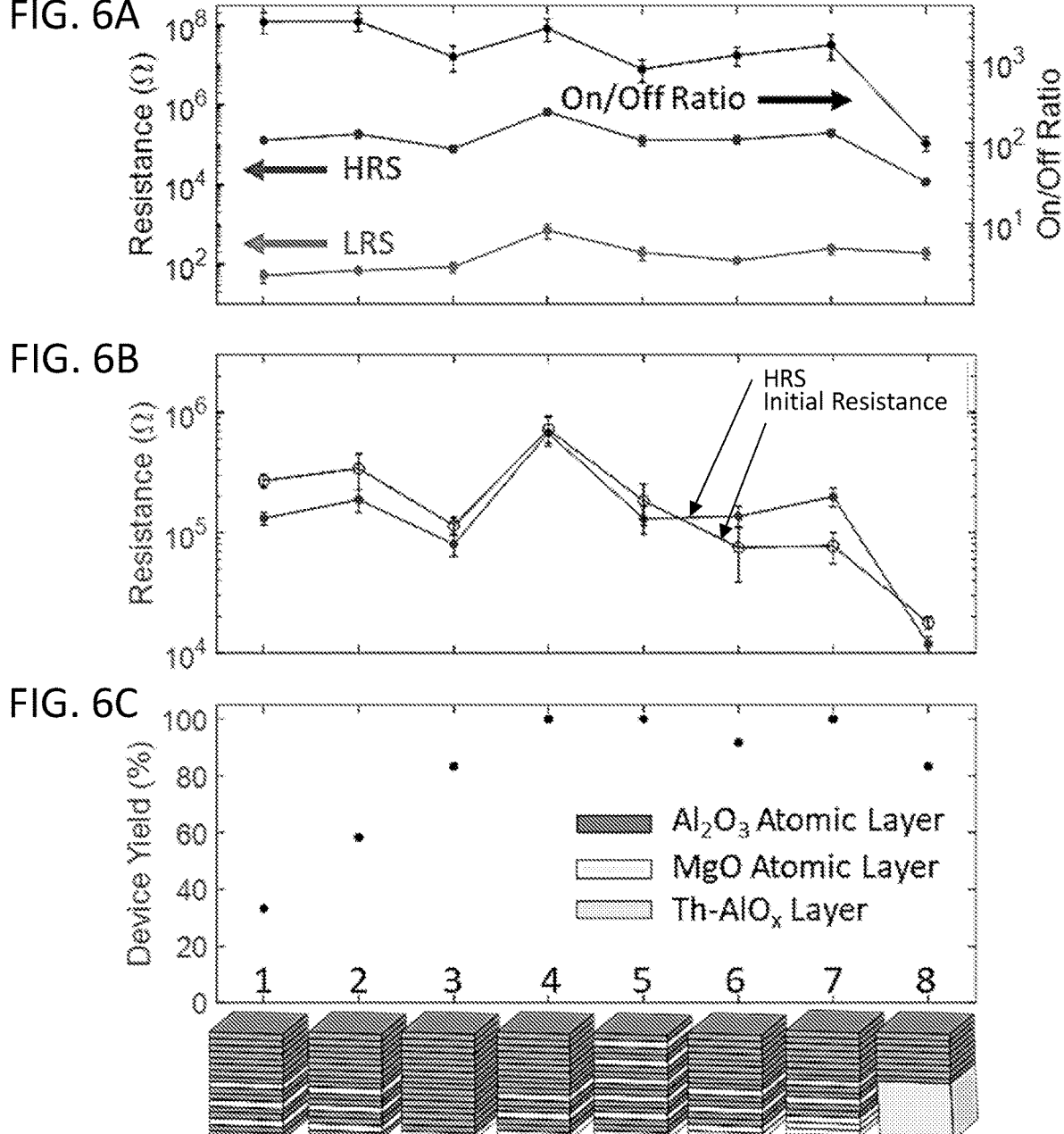
FIG. 6A shows On/Off ratio (top), HRS (middle), and LRS (bottom) values.
FIG. 6B shows a comparison between initial resistance value (open circles) and repeatable operating HRS value (solid circles) for Samples 1-8 (structures shown at the bottom of FIG. 6C).s.
FIG. 6C shows device yield for the samples. All have the total (M1+M2) thickness of 17 C (or ~1.9 nm). Sample 8 has 8 C of ALD-$Al_2O_3$ grown on 1 nm thick defective Th—$AlO_x$ (M1/M2 thickness ~1.9 nm).

Illustrative memristor designs based on the present approach are shown in, e.g., FIG. 3A, panels (b)-(d); FIGS. 4A-4B; and samples 1-7 below FIG. 6C. Using FIGS. 4A and 4B as an example, these figures show memristors consisting of a dielectric stack of ALD-grown atomic sublayers of $Al_2O_3$ and MgO between top and bottom electrodes. FIG. 3A, panels (b)-(d) and samples 1-7 below FIG. 6C show similar memristors but including those having different orderings/numbers of the ALD-grown atomic sublayers of $Al_2O_3$ and MgO.

Figure 8:
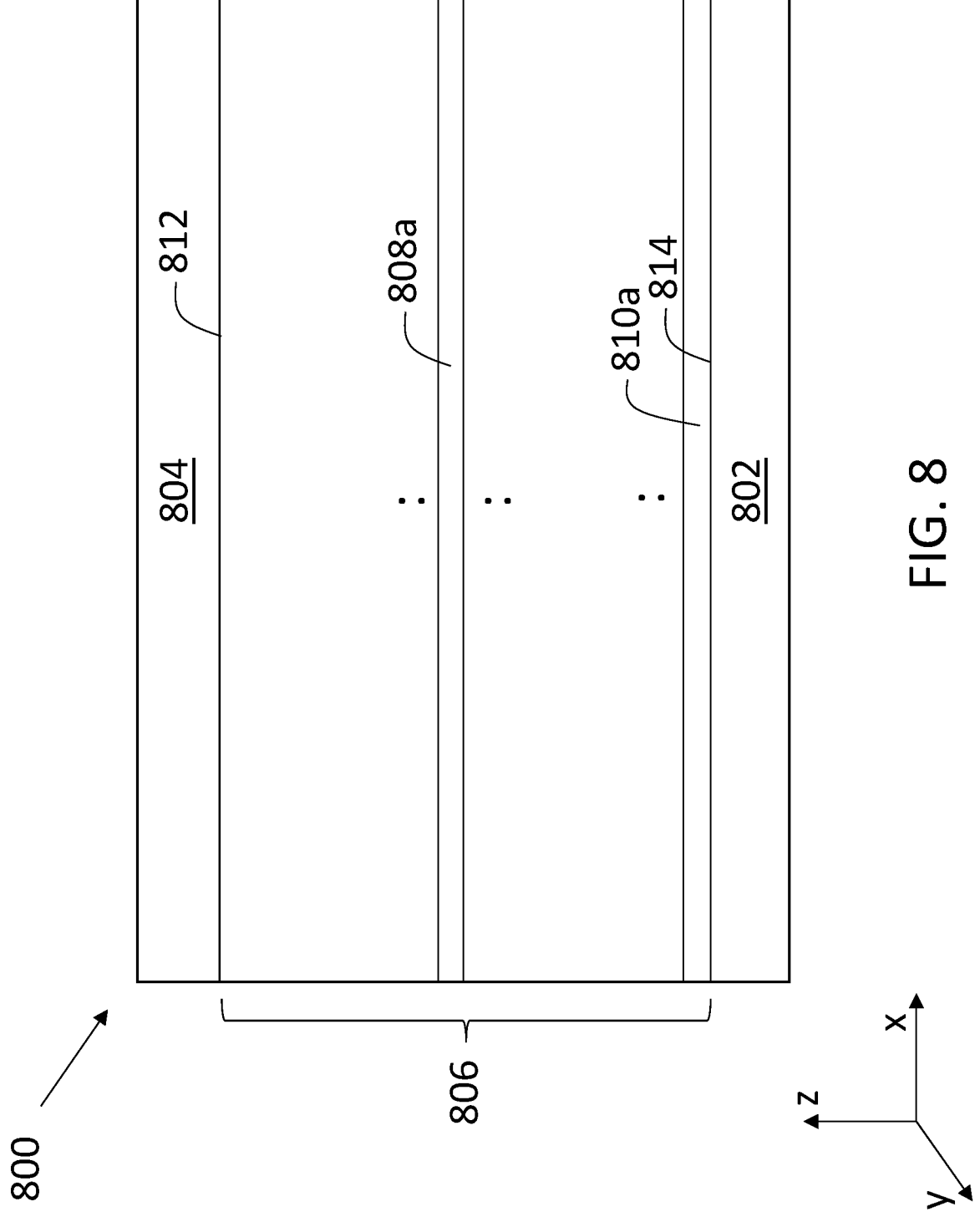
FIG. 8 depicts a schematic of a cross-section of a memristor according to an illustrative embodiment.

FIG. 8 shows a cross-section of another illustrative memristor 800 comprising a first ALD-grown atomic sublayer of a poor oxide (e.g., MgO) 810a positioned within a dielectric stack 806 such that it forms a bottom interface 814 with a bottom electrode 802 (and thus, is in direct contact with the bottom electrode 802). This is a feature that is avoided in some conventional memristors as it would be expected to decrease resistance when the resistance of the dielectric material is generally desired to be as high as possible. In embodiments, the bottom electrode 802 is an Ohmic electrode. Specific embodiments of the memristor 800 are shown in FIG. 3A, panels (c)-(d), FIGS. 4A-4B, and samples 3-7 below FIG. 6C. As discussed in the Example, below, use of the ALD-grown atomic sublayer of MgO directly on the Ohmic electrode of in these embodiments prevents dielectric breakdown and improves device yield (e.g., compare sample 4 below FIG. 6C to samples 1 and 2 below FIG. 6C.) In further embodiments, one or more additional (e.g., two, three, four) ALD-grown atomic sublayers of the poor oxide (e.g., MgO) are positioned within the dielectric stack 806 directly in contact with the first ALD-grown atomic sublayer of the poor oxide 810a. Such embodiments are shown in samples 6-7 below FIG. 6C. As discussed in the Example, below, these embodiments unexpectedly lead to the resulting memristor exhibiting a higher stabilized HRS as compared to an initial HRS (e.g., compare samples 6 and 7 below FIG. 6C to sample 4 below FIG. 6C).

In embodiments, including those based on memristor 800 of FIG. 8, described above, a first ALD-grown atomic sublayer of a poor oxide (e.g., MgO) is positioned within a dielectric stack such that it forms a bottom interface with a bottom electrode and a second ALD-grown atomic sublayer of the poor oxide is positioned within the dielectric stack such that it forms a top interface with a top electrode. Thus, in these embodiments, the poor oxide is positioned in direct contact with both electrodes of the memristor.

In embodiments, including those based on any of those described above, the dielectric stack of the memristor comprises at least two (e.g., two, three, four) ALD-grown atomic sublayers of a poor oxide (e.g., MgO). One of these may be positioned such that it contacts a bottom electrode, including an Ohmic electrode. The other of the at least two ALD-grown atomic sublayers of the poor oxide may be positioned within the dielectric stack such that it is sandwiched between surrounding ALD-grown atomic sublayers of a good oxide (e.g., Al$_2$O$_3$). Such embodiments are shown in FIG. 3A, panel (d), FIGS. 4A-4B, and samples 4-7 below FIG. 6C. As discussed in the Example, below, these embodiments lead to higher HRS, higher on/off ratios, and higher device yield (e.g., compare sample 4 below FIG. 6C to sample 3 below FIG. 6C).

In embodiments, including those based on any of those described above, the dielectric stack of the memristor is characterized by having an asymmetric distribution of the ALD-grown atomic sublayers between the top and bottom electrodes, e.g., an asymmetric distribution of the ALD-grown atomic sublayers of the first metal oxide between the top and bottom electrodes and an asymmetric distribution of the ALD-grown atomic sublayers of the second metal oxide between the top and bottom electrodes. Such embodiments are shown in FIG. 3A, panels (b), (c), and (d); FIGS. 4A-4B; and samples 1, 2, 3, 4, 6, and 7 below FIG. 6C. By contrast, sample 5 below FIG. 6C is characterized by a symmetric distribution of the ALD-grown atomic sublayers in which the ALD-grown atomic sublayers of the first and second metal oxides are uniformly and periodically distributed between the top and bottom electrodes. As discussed in the Example, below, asymmetric embodiments lead to higher HRS values and higher on-off ratios (e.g., compare asymmetric sample 4 below FIG. 6C to symmetric sample 5 below FIG. 6C.)

In variations of any of the asymmetric embodiments described above, the dielectric stack of the memristor may be further characterized by having all of the ALD-grown atomic sublayers of one of the first and second metal oxides (e.g., the poor oxide such as MgO) being positioned within a certain subregion of the dielectric stack, e.g., within a subregion that is no more than 60% of the thickness of the dielectric stack. This subregion may be one that is closer to one of the two electrodes than the other. Such embodiments are shown in FIG. 3A, panels (b), (c), and (d); FIGS. 4A-4B; and samples 1, 2, 3, 4, 6, and 7 below FIG. 6C. In other embodiments, the positioning is within a subregion that is no more than 50% of the thickness of the dielectric stack or no more than 40% of the thickness of the dielectric stack. Again, this subregion may be closer to one electrode than the other.

The asymmetric embodiments described herein result in an asymmetric distribution of the $V_O$ within the dielectric stack of the memristor, including $V_O$ distributions which are concentrated within any of the subregions described above. The asymmetric embodiments described herein represent another unique feature different from approaches used in the design of some conventional memristors wherein the goal is to achieve a uniform distribution of the metal oxides and the $V_O$ throughout the dielectric material of the memristor.

Any of the embodiments of the memristors described herein based on first and second metal oxides (e.g., Al$_2$O$_3$ and MgO) may include one or more ALD grown atomic sublayers of a third metal oxide (e.g., Ga$_2$O$_3$).

The present memristors may be characterized by their conduction mechanism through the dielectric stack thereof in the high resistance state of the memristor. As demonstrated in the Example, below, this conduction mechanism is via tunneling. This may be confirmed by measuring HRS values and on/off ratios for the memristor as a function of dielectric stack thickness and obtaining a linear slope in a semi-log scale of resistance (or voltage) versus thickness (see FIGS. 4E-4F). This is by contrast to memristors which exhibit a space charge limited conduction mechanism.

As noted above, the present memristors may be characterized by a variety of properties. Techniques for measuring these properties are described in the Example, below. In embodiments, the memristor is characterized by an $E_T$ value of greater than 1 eV, at least 1.2 eV, at least 1.4 eV, at least 1.6 eV, at least 1.8 eV, or at least 2 eV. In embodiments, the memristor is characterized by an on/off ratio of at least 10, at least 10$^2$, at least 10$^3$, at least 10$^4$, or at least 10$^5$. In embodiments, the memristor is characterized by a switching time constant of no more than 0.1 ns, no more than 1 ns, no more than 100 ns, no more than 500 ns, no more than 1 ms, or a range of from 0.1 ns to 100 ms. In embodiments, the memristor is characterized by a device yield of at least 85%, at least 90%, or at least 95%. These properties may be associated with any of the disclosed memristors having a dielectric stack thickness of no more than about 5 nm, including no more than about 3 nm or no more than about 1.1 nm.

As noted above, methods for fabricating the present memristors involve the use of ALD to grow the atomic sublayers of the first and second metal oxides. Illustrative methods are described in the Example, below. The systems and ALD-growth conditions described in U.S. Pat. Nos. 9,994,956 and 10,593,871 may also be used, each of which is hereby incorporated by reference in its entirety.

Also encompassed are arrays and devices incorporating any of the disclosed memristors. Regarding devices, the memristors (or arrays thereof) may be used as a component of any type of electric circuit and/or device in which memristors are generally used, e.g., such as a superconducting quantum interference device (SQUID).

Example

Introduction

This Example reports the first atomically tunable Pd/M1/ M2/Al ultrathin (<2.5 nm M1/M2 bilayer oxide thickness) memristors using in vacuo (i.e., in situ) atomic layer deposition by controlled insertion of MgO atomic layers into pristine $Al_2O_3$ atomic layer stacks guided by theory predicted Fermi energy lowering leading to a higher high state resistance (HRS) and a reduction of oxygen vacancy formation energy. Excitingly, memristors with HRS and on/off ratio increasing exponentially with M1/M2 thickness in the range 1.2-2.4 nm have been obtained, illustrating the tunneling mechanism and a tunable on/off ratio in the range of $10$-$10^4$. Further dynamic tunability of the on/off ratio by electric field is possible by designing of the atomic M2 layer and M1/M2 interface. The results demonstrate the rational design of memristors with atomically tunable performance parameters.

Experimental Methods

Sample Fabrication—A set of ultrathin memristors with an M1/M2 bilayer structure composed of ALD-$Al_2O_3$ (ALD-MgO)/ALD-MgAlO$_x$ (all ALD memristors) was fabricated using in vacuo ALD. A selected number of ALD-MgO layers were inserted for tuning of the electronic structure and $V_O$ concentration of the M1 and M2 layer. The thickness of the M1 layer was varied in the range of 0.6 nm-2.3 nm. Since each ALD-$Al_2O_3$ or ALD-MgO atomic layer has a thickness of ~0.11 nm, the resolution of the thickness control is truly atomic via controlling the number of M1 ALD-$Al_2O_3$/MgO atomic layers in the range of 5-21. The memristors were defined using a shadow mask to allow 12 memristors to be fabricated on each chip with three different areas of 200×200, 200×300, and 200×400 $\mu m^2$ for uniform examination. DC magnetron sputtering of Al and Pd electrodes was carried out in an in vacuo ALD system at a base pressure of $<5 \times 10^{-7}$ Torr, using an Ar plasma (14 mTorr/90 W for Al, 30 mTorr/45 W for Pd). (Elliot A. J. et al., Rev Sci Instrum, 85, 073904 (2014).) Specifically, the Si/$SiO_2$ (500 nm) substrate was transferred to the sputtering chamber from a load-lock chamber via a transfer rod where an Al electrode was deposited. To make the M1/M2 layer, the ALD chamber was preheated to a temperature of ~225° C., followed by sample transfer into the ALD chamber and dynamically heating for 25 minutes with blackbody radiation from the sides of the chamber. This dynamic heating was found critical to minimizing M/I IL formation at the Al interface. The sample was then subjected to alternating precursor pulses of $H_2O$ and either Trimethyl-Aluminum (TMA) or Bis(cyclopentadienyl)magnesium(II) ($MgCp_2$) assisted by a flow of 5 SCCM of $N_2$. The precursor pulses were fully computer controlled to allow the ALD-MgO and ALD-$Al_2O_3$ atomic layers to be stacked in any order or amount desired. Once the M1/M2 layer was grown, the sample was transferred in vacuo back to a high vacuum chamber to let it cool in a low oxygen environment. Post-cooling, the sample was then removed from vacuum, and the $2^{nd}$ shadow mask was mounted for deposition of the top Pd electrode. For comparison, a set of memristors with 1 nm defective Th—AlO$_x$ M2 and ALD M1 was fabricated with total M1/M2 thickness ranging from 1.5-3.0 nm. For these samples, the main difference was that the sample was allowed to cool post Al deposition and then was placed in the loadlock chamber to undergo oxidation using high purity $O_2$ at ~2 Torr for 520 seconds, resulting in ~1040 Torr·s, which was estimated to result in approximately 1 nm of defective Th—AlO$_x$ oxide M2 layer.

Ex Vacuo Sample Characterization. Electrical measurements of the shadow-mask-fabricated samples were carried out using 25 $\mu m$ tungsten probes in a probe station in conjunction with an Agilent B1500 semiconductor analyzer. The Pd electrode was grounded while the Al electrode was biased. Initial low voltage (−500 mV to 500 mV) sweeps of each device fabricated were performed to probe the initial resistance. HRS and LRS values were measured at 100 mV, a point at which the Schottky barrier is still effective. Very slight electroforming appeared to be necessary in these devices as their first switch usually required a slightly higher voltage than the average switching voltage. Electrode resistance from the Pd and Al wires was subtracted because in normal photomask samples the electrodes would be thick enough so that their resistance would be negligible.

In Vacuo Scanning Tunneling Spectroscopy (STS) was taken using an RHK UHV system at ~$10^{-10}$ Torr. STS samples were measured by fabricating a half-cell of the memristor structure, i.e., the fabrication steps were all the same except the sample was transferred for examination after the M2/M1 bilayer was grown. Local density of states (LDOS) was proportionately measured through dI/dV spectra collected using a mechanically cleaved PtIr tip by sweeping a DC voltage from 0 to 2.3 V with a lock-in amplifier analyzing the 45 mV 5 kHz AC signal on top of the DC signal. Approximately 60-80 spectra were randomly taken as the films were too sensitive for scanning tunneling microscopy scans. Using two bisquare fits, the intersection of the conduction band and band gap regions were estimated to estimate $E_b$, also known as the barrier height $E_b$, as well as high-quality ALD coverage rate.

DFT Simulation. DFT calculations were performed using projector augmented wave (PAW) potentials with the HSE06 hybrid functional as implemented in the Vienna Abinitio Simulation Package (VASP). (Blöchl P. E. Physical Review B, 50, 17953-17979 (1994); Heyd J. et al., [J. Chem. Phys. 118, 8207 (2003)]. The Journal of Chemical Physics, 124, 219906 (2006); Kresse G. et al., Physical Review B, 54, 11169-11186 (1996); Kresse G. et al., Physical Review B, 47, 558-561 (1993).) The mixing parameter was set to 32%. A 120-atom supercell with periodic boundary conditions was used for all the defect calculations. Using a Γ-centered 2×2×2 k-point grid with a plane wave expansion cutoff of 400 eV, all structures were relaxed until the forces were smaller than 10 meV/Å. The defect formation energies were calculated using the formalism outlined in Freysoldt et al. (Freysoldt C. et al., Reviews of Modern Physics, 86, 253-305 (2014).) The chemical potentials were limited by the formation of $MgAl_2O_4$. Charge state corrections were calculated using the sxdefectalign code. (Freysoldt C. et al., physica status solidi (b), 248, 1067-1076 (2011); Freysoldt C. et al., Phys Rev Lett, 102, 016402 (2009))

Results and Discussion

DFT Simulations of $V_O$ Doping of Pristine $Al_2O_3$ for Memristors

Figures 1A, 1B:
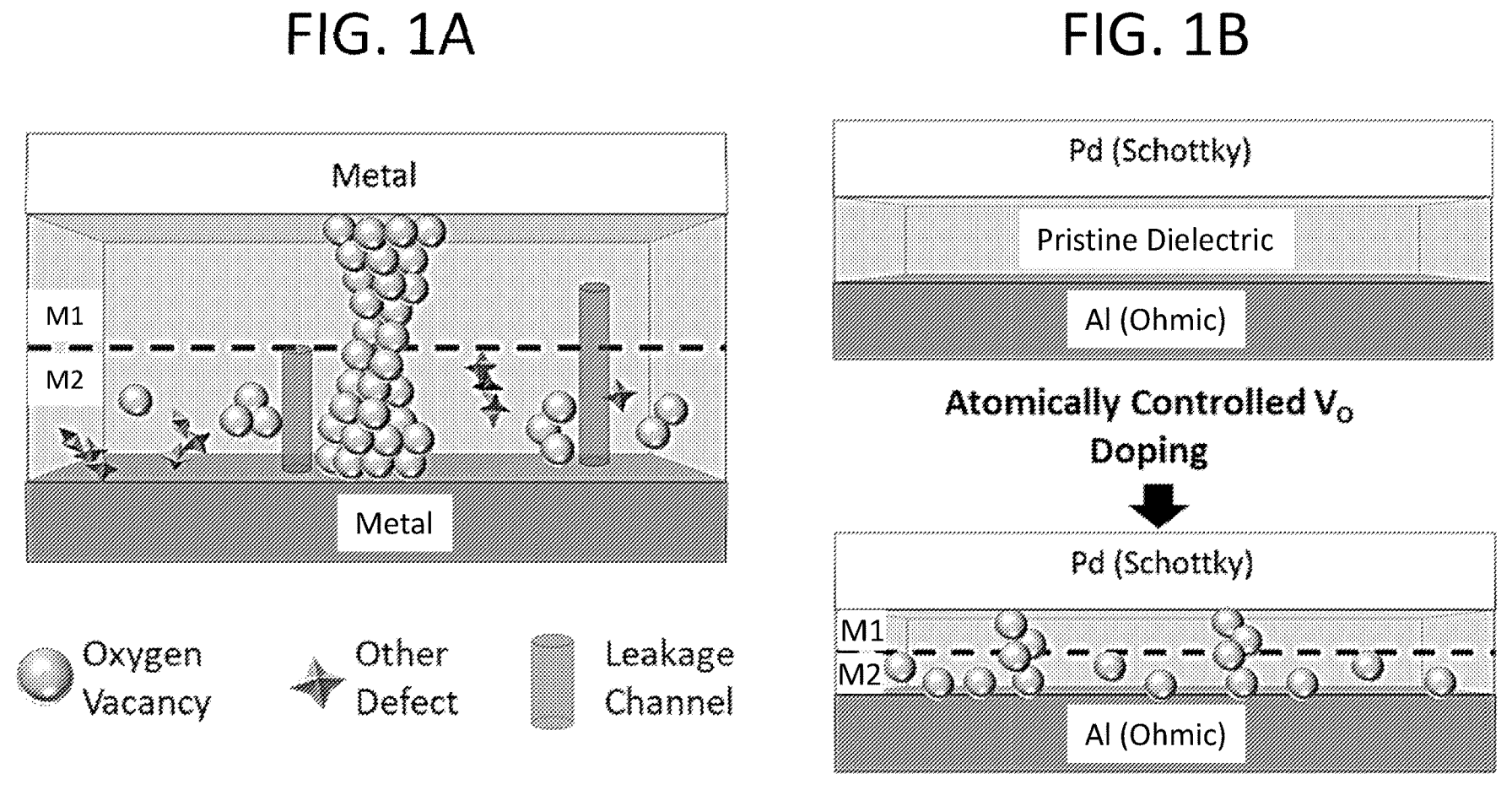

FIG. 1A shows schematically the defects typically formed in a memristor with a M1/M2 stack, in which the M1 layer is intended to be a higher quality insulator while the M2 layer is a "poorer" quality dielectric intended to have more $V_O$. The presence of other unintended defects including interstitials, vacancies of metals, nonuniform $V_O$ clusters, and various growth defects implies that the formation of CFs is likely to be highly nonuniform during the memristor SET/RESET operation. In particular, some of these defects may lead to the formation of leakage channels and large CFs, which can lead to poor endurance and prevent achievement of ultrathin memristors with atomic tunability. FIG. 1B shows an ultrathin $Al_2O_3$ pristine dielectric on an Al electrode obtained using in vacuo ALD with a negligible M/I IL, in which there is insufficient $V_O$ for memristive switching. However, by introducing $V_O$ with atomic control (FIG. 1B), atomically tunable ultrathin memristors may be achieved, as demonstrated below.

In order to explore the atomic doping of pristine $Al_2O_3$, DFT simulations at the hybrid functional level were carried out. Among candidates analyzed, Mg-doping in $Al_2O_3$ was revealed to be unexpectedly beneficial for memristor applications. In FIGS. 2A-2B, the calculated formation energy was plotted as a function of Fermi level (between the valence band maximum and the conduction band minimum) under (FIG. 2A) Al rich and (FIG. 2B) O rich conditions, for native defects ($V_O$, aluminum vacancy ($V_{Al}$), and aluminum interstitial ($Al_i$)) and all Mg related defects (Mg substituting on Al ($Mg_{Al}$) or O (Mgo) sites and Mg interstitials ($Mg_i$)). The slope of the lines indicates the charge state of each defect. These formation energy diagrams shed light on the role of Mg doping, as the requirement of charge neutrality determines the actual position of the Fermi level. In the absence of Mg, the native defects with lowest formation energy, and thus those that are most likely to form, include $V_{Al}$, $V_O$, and $Al_i$. These will lead to a Fermi level position within the grey area (FIG. 2A, Al rich conditions) or vertical dashed line (FIG. 2B, O rich). Once Mg is added, the likely Fermi level position will shift towards the valence band maximum, as indicated by the arrows and the solid vertical lines. Note that these are the results for the two extremes of chemical potentials, namely Al rich and O rich. In typical ALD growth, neither of these conditions is representative. To better mimic ALD growth conditions, the O chemical potential was set to –0.65 eV in FIG. 2C. Again, the same behavior was observed: doping with Mg, which acts as a deep acceptor, lowered the Fermi level during growth. This downward shift has two important consequences: (1) a lower Fermi level indicates that the Mg-doped $Al_2O_3$ will be more insulating and thus more resistive in the HRS, as confirmed later by experimental measurements, and (2) at these lower Fermi levels, the formation energy of $V_O$ was lower, indicating that more $V_O$ will be formed. $V_O$ are typically double donors in binary oxides (and confirmed by the inventors' calculations), implying that their formation energy will be lower for lower Fermi levels. At the same time, oxides are usually unintentionally n-type doped. This lower Fermi level renders the material more insulating by compensating for the presence of donor defects. Both are desirable to improve the performance of $Al_2O_3$-based memristors.

Atomically-Controlled $V_O$ Doping Guided by DFT Simulations

Experimentally, Mg doping in $Al_2O_3$ may be achieved by insertion of an MgO atomic layer into $Al_2O_3$ atomic layer stacks grown on Al. Since ALD growth can truly occur layer by layer by carefully controlling the M/I interface and ALD conditions, the $MgO/Al_2O_3$ atomic layer stacks obtained using in vacuo ALD allow atomic-scale controlled $V_O$ doping. FIG. 3A, panels (a)-(d) illustrates a few samples including a stack of: 17 $Al_2O_3$ atomic layers (FIG. 3A, panel (a)), 14 $Al_2O_3$ atomic layers with 3 MgO atomic layers inserted at $3^{rd}$, $6^{th}$ and $9^{th}$ layer positions above the Al electrode at the bottom (FIG. 3A, panel (b)), 16 $Al_2O_3$ atomic layers with 1 MgO atomic layer inserted at the $1^{st}$ layer position immediately on the Al electrode (FIG. 3A, panel (c)), and 14 $Al_2O_3$ atomic layers with 3 MgO atomic layers inserted at $1^{st}$, $4^{th}$ and $7^{th}$ layer positions above the Al electrode (FIG. 3A, panel (d)). It should be noted that all four samples had the same M1/M2 stack thickness of ~1.9 nm (17 total ALD cycles at ~0.11 nm/cycle for MgO and $Al_2O_3$ atomic layers) to allow a direct comparison of memristor performance. Without MgO, negligible $V_O$ and other defects were expected in the pristine $Al_2O_3$ atomic layer stack (FIG. 3B, panel (a)), which was confirmed in the representative in vacuo scanning tunneling spectroscopy (STS) dI/dV spectrum shown in FIG. 3C, panel (a), with a large $E_b$ of 1.79 eV and hard dielectric breakdown. In the memristive SET/RESET operation on this device, no sustainable memristive switches were observed except a permanent dielectric breakdown (FIG. 3D, panel (a)), which is consistent with the STS observation and anticipated result for a pristine dielectric. This result also confirms that the M1/M2 layer for memristors differs from tunnel barrier layers (TBLs) of tunnel junctions since the M1/M2 layer requires charge carriers (or $V_O$) while the TBLs require pristine insulators without mobile charge carriers.

By inserting 3 MgO atomic layers at $3^{rd}$, $6^{th}$ and $9^{th}$ layer positions above the Al electrode at the bottom (FIG. 3A, panel (b)), $V_O$ was introduced in the $Al_2O_3$ atomic layers nearby (FIG. 3B, panel (b)). This is illustrated in the in vacuo STS dI/dV spectrum (FIG. 3C, panel (b)) including the rounding of the spectrum's conduction band onset from that of a pristine insulator and slightly reduced $E_b$ to 1.70 eV as compared to the case without doping as shown in panel (a) of FIGS. 3A-3D. This $V_O$ doping is important since a few memristive switches were indeed observed (FIG. 3D, panel (b)) despite low endurance and device yield. In the sample shown in panel (c) of FIG. 3A, a single ALD-MgO atomic layer was inserted as the M2 layer on the Al electrode. This localized the $V_O$ near the interface with the Al electrode. FIG. 3C, panel (c), shows a slight dip in $E_b$ of the sample down to ~1.38 eV, illustrating the increased carrier doping in the M1/M2 layer. Unlike the two samples with no M2 layer (the samples of panel (a) of FIG. 3A and panel (b) of FIG. 3A make use of an $Al_2O_3$ atomic layer to form an interface with the Al electrode), the sample with a single ALD-MgO atomic layer as the M2 layer (panel (c) of FIG. 3A) showed sustainable memristive switching (FIG. 3D, panel (c)). As noted above, the sample of FIG. 3A, panel (c), differs from that of FIG. 3A, panel (a), and FIG. 3A, panel (b), in having a single MgO inserted at the $1^{st}$ layer position above the Al electrode. The memristive switch enabled by this single MgO atomic layer indicates the importance of $V_O$ doping near the M/I interface. The sample of FIG. 3A, panel (d), contained a single MgO atomic layer as the M2 layer and two additional MgO layers in the M1 $Al_2O_3$ stack. The combination of the $V_O$ doping in both M1 and M2 layers using MgO atomic layer insertion led to a more comprehensive $V_O$ doping effect, but similar overall barrier quality as seen in FIG. 3C, panel (d), which shows a representative $E_b$ of ~1.38 eV. The benefit of $V_O$ doping in both M1 and M2 is demonstrated by the sustainable switching between HRS and LRS (FIG. 3D, panel (d)) and high device yield ~100%. It should be noted that both samples of FIG. 3A, panels (b) and (d), had 3 MgO layers. The difference in their electronic structures revealed from the in vacuo STS study indicates that the number and location of the inserted MgO atomic layers are both important to atomic tuning of memristor parameters.

Design of M1 Layer for Atomically Tunable Memristors

FIGS. 4A and 4B compare two memristors with 3 MgO atomic layers inserted in $1^{st}$, $4^{th}$ and $7^{th}$ layer positions (similar to that in FIG. 3A, panel (d)), while the total M1/M2 thicknesses are 20 C (2.2 nm) and 14 C (1.5 nm), respectively. Considering the two devices both had 1 C MgO in the M2 layer and 2 MgO layers in M1 at the same positions, the major difference between the two devices is their M1 layer thicknesses through the addition of $Al_2O_3$ atomic layers. The two devices exhibited the anticipated hysteretic I-V curves which differed quantitatively in their HRS and hence on/off ratio values due to the M1 layer thicknesses. Indeed, the HRS values for the 20 C and 14 C memristors were 3.98 MΩ and 17.4 kΩ, respectively, while the LRS values were comparable. This resulted in an on/off of ~$10^4$ for the 20 C memristor and ~20 for the 14 C memristor.

Figure 4F:
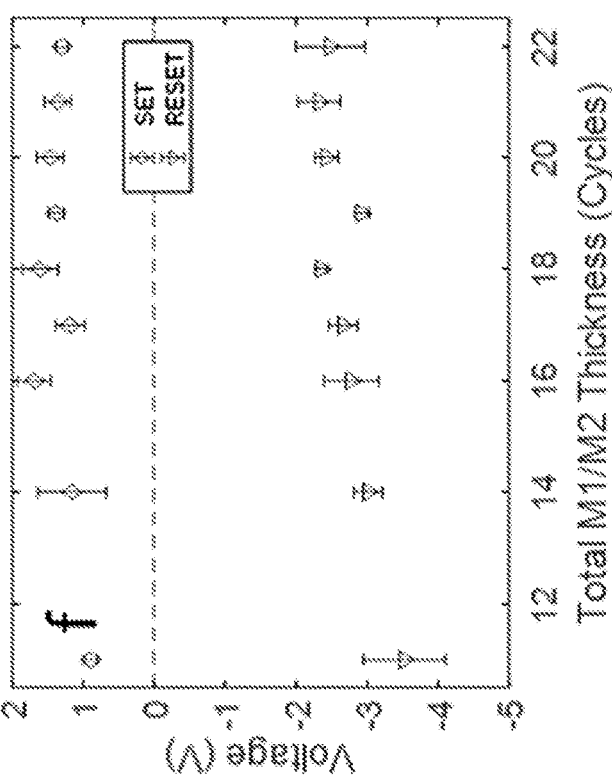
FIG. 4F shows SET and RESET voltages as a function of the atomic layer numbers in M1/M2 stack with the similar architecture shown in FIGS. 4A-4B.
Figure 4E:
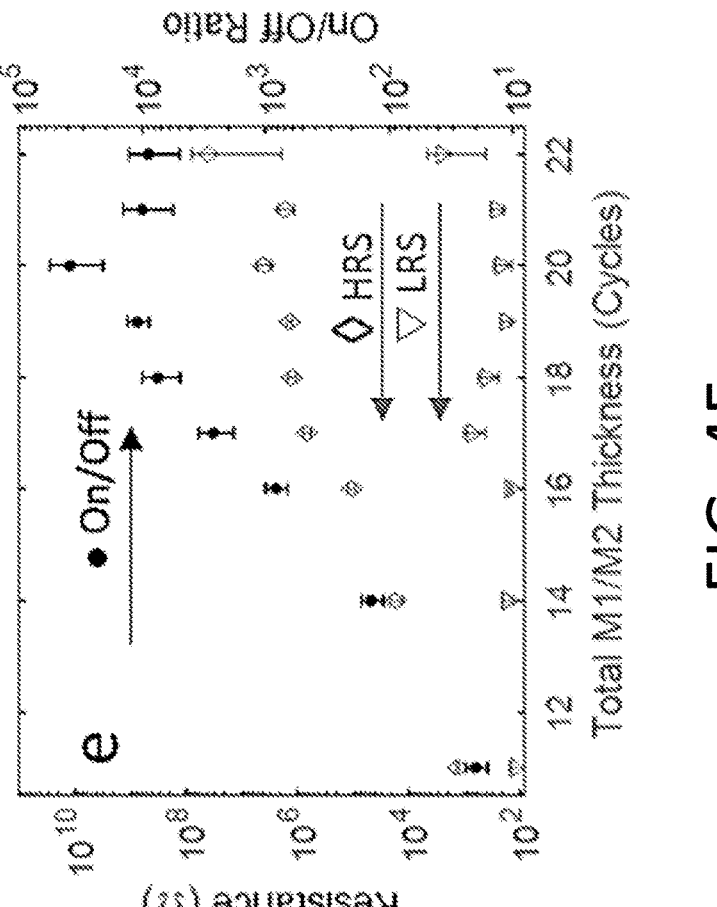
FIG. 4E shows HRS (diamond), LRS (triangle), and on/off ratio (circle) values.

To further understand the effect of the M1 layer thickness on the memristor parameters, the HRS, LRS, on/off, and SET/RESET voltage values of memristors with a total M1/M2 layer thickness varied in the range of 11-22 C, or equivalently the M1 thickness varied from 10-21 C (all devices have 1 MgO layer as the M2 layer at the Al electrode interface), are illustrated in FIGS. 4E and 4F, respectively. As shown in FIG. 4E, the HRS (middle) and on/off ratio (top) exhibited a monotonic increase with thickness and peak at M1/M2 thickness=20 C. In the semi-log scale, the curves were linear, indicating an exponential dependence on the M1 thickness and the "tunneling" nature of the memristive HRS conduction. This observation is important as it is the first demonstration of a quantitative tunability of the memristor parameters by varying the dielectric thickness. For example, the on/off ratio was tunable in the range of $10$-$10^4$ as the M1/M2 layer thickness was varied between 11-22 C (1.2-2.4 nm). At larger thicknesses, a drop in HRS and on/off ratio was observed. Meanwhile, LRS remained more or less constant in almost the entire thickness range, likely due to the LRS consisting of series CF and wire resistances, except an upturn for 22 C, suggesting the CF formation may be incomplete. Based on the trends in both HRS and LRS as a function of thickness, but without wishing to be bound to a particular theory, it is thought that CF formation/annihilation may become difficult or incomplete above a critical M1 thickness. This argument is validated considering the tunnel mechanism of memristors revealed in FIG. 4E.

FIG. 4F displays the average SET and RESET voltages of the memristors shown in FIG. 4E. A fairly constant SET voltage of 1.0-1.5 V and RESET voltage of −2.0 to −3.5 V were observed on these devices. SET and RESET voltages are typically more dependent on diffusivity and switching pulse programming parameters (compliance current, pulse length, etc.) and mostly independent of material selection in metal oxides. A possible explanation for the slight deviation from the trend with the 11 C thick sample is that it was possible to get SET at a lower voltage due to the much lower HRS (~$10^3Ω$) compared to the next point in the set (~$10^4Ω$). Together, the results of FIGS. 4A-4F demonstrate that the M1 layer was the primary provider of resistance in the resistive switching mechanism in these devices.

Effect of M/I IL on Memristor Performance

It should be noted that all devices in FIGS. 4A-4F had a single MgO atomic layer as the M2 in the M1/M2 stack. In order to understand the difference made by this ALD-M2 layer from an M2 layer made with other methods, another set of memristors was fabricated with an ALD-$Al_2O_3$ M1 layer on a defective aluminum oxide M2 formed through oxygen diffusion into an Al electrode (Th—$AlO_x$) under controlled oxygen pressure and exposure time at room temperature. The microstructure of the Th—$AlO_x$ is schematically shown in FIG. 1A in which a nonuniform distribution of $V_O$ in the form of atomic defects and clusters and other defects were anticipated. Such a nonideal defect structure is responsible for tunnel barrier leakage when Th—$AlO_x$ thickness is <0.6 nm and low barrier height $E_b$<<1.0 eV. (Wilt J., Gong Y. et al., *Physical Review Applied*, 7, 064022 (2017).) The defective Th—$AlO_x$ M2 layer has a direct impact on the quality of the ALD-M1 layer grown on top in that it extends the defective structure into the M1 layer, which in turn affects the $E_b$ of the M1 as shown schematically in FIGS. 5A-5B. This was confirmed in the in vacuo STS study of the electronic structures of the ALD-M1 layers on the two different kinds of M2 layers. FIG. 5C shows a representative STS dI/dV spectrum taken on the sample having an M1 layer consisting of 2 MgO layers inserted on the $4^{th}$ and $7^{th}$ layer positions in 6 $Al_2O_3$ atomic layers on a single ALD-MgO M2 layer (this sample is similar to that of FIG. 3A, panel (d)). An average $E_b$ of 1.45±0.08 eV was observed for this sample. Comparatively, FIG. 5D shows an STS dI/dV spectrum for a sample having an M1 layer consisting of 10 $Al_2O_3$ layers grown on a Th—$AlO_x$ M2 layer (~1 nm in thickness), giving an average $E_b$ of 0.75±0.01 eV. The higher $E_b$ value for the device of FIG. 5A denotes a higher quality insulator with a lower defect concentration. The much-reduced $E_b$ value for the ALD-$Al_2O_3$ M1 layer of the FIG. 5B sample confirms that the defects in the Th—$AlO_x$ M2 layer indeed extended into the M1 layer and degraded the dielectric quality of the M1 layer, which in turn impacted memristor performance.

FIG. 5E shows the log-scale plot of both HRS and LRS for the samples of FIG. 5A and FIG. 5B. The plot shows an exponential increase in HRS with M1/M2 total thickness for both kinds of memristors, with either 1 ALD-MgO M2 (open) or Th—$AlO_x$ M2 (solid) layer. The LRS values remained fairly constant for the 1 ALD-MgO M2 sample (solid red) while some random jumps are visible for the Th—$AlO_x$ M2 sample (open red), which were likely due to the randomness and nonuniformity of defects in the Th—$AlO_x$. An example of this can be seen in both $Al_2O_3$ (5 C)/Th—$AlO_x$ and $Al_2O_3$ (8 C)/Th—$AlO_x$ memristors which show almost no change in HRS even with the added 3 C of dielectric in the M1 layer. In fact, the monotonic increasing M1/M2 thickness dependence of HRS was observed only at larger thickness above 17 C total thickness for memristors using a Th—$AlO_x$ M2 layer. This is in contrast to the case of the memristors with an ALD-MgO M2 layer, for which the total M1/M2 layer thickness can be thinner, while still exhibiting relatively high on/off ratios. For example, the memristor having the ALD-MgO M2 layer and 11 C total M1/M2 thickness and exhibiting an on/off ratio of >10 is believed to be the thinnest ALD-based memristor ever reported.

In order to quantify the effect of the two kinds of the M2 layers (1 ALD-MgO M2 versus Th—$AlO_x$ M2) on memristor parameters, the resistance-area (RA) product was fit as a function of M1/M2 thickness with the following tunneling current equations:

$$G = \frac{1}{RA} \propto J_{Tunnel} \tag{1}$$

$$G = G_0 \exp\left(-\frac{\sqrt{2m_eE_T}}{\hbar}d\right) \tag{2}$$

where G is the conductance of the device, R is the HRS, A is the device area, $m_e$ is the mass of the electron, d is the thickness of the tunnel barrier layer (or M1/M2 thickness in memristors), and $E_T$ is the total barrier height. FIG. 5F shows the results, giving an $E_T$ of 2.64±0.01 eV (for the memristors with 1 ALD-MgO M2) and an $E_T$ of 1.94±0.01 eV (for the memristors with Th—$AlO_x$ M2) The higher $E_T$ value for the 1 ALD-MgO M2 memristors implies a higher specific tunability of HRS per thickness. Note that the fitted $E_T$ values in both sets of memristors are higher than the $E_b$ values measured from STS dI/dV spectra. This is different for the tunnel barrier layers of tunnel junctions in which the STS measured $E_b$ is very close to the $E_T$ obtained by fitting the device tunneling resistance vs tunnel barrier thickness curve. This difference can be attributed to the presence of a Schottky barrier ($V_{Sch}$) in memristors, as compared to tunnel junctions which have two Ohmic contacts. Thus, for memristors, $E_T = V_{Sch} + E_b$. Subtracting the $E_b$ from $E_T$ for the corresponding memristors results in $V_{Sch}$ values of $1.19 \pm 0.08$ eV and $1.19 \pm 0.01$ eV for the memristors on the 1 ALD-MgO and Th—$AlO_x$ M2, respectively. This means that the Schottky barrier adds an additional barrier height of 1.19 eV when forming between the Pd electrode and the underlying ALD-$Al_2O_3$ atomic layer and works in conjunction with the $E_b$ to provide extremely high resistances at small read voltages. The much higher $E_b$ values, and hence $E_T$ values, for the memristors having the 1 ALD MgO M2 layer indicates that unintended defects (especially those with high nonuniformity and large dimensions potentially causing leakage, low device yield, and endurance) can be minimized by use of a single ALD MgO M2 layer. It is surprising that use of a single atomically thin MgO M2 layer was enough to achieve such high $E_T$ values, as well as the high HRS and on/off ratios shown in FIG. 5E. Furthermore, the comparable electronic structure of the M1 layer grown on top of this ALD MgO M2 layer shows that the $V_O$ doping in this M2 layer was at the atomic level and did not lead to defective structures on the M1 layer grown on top.

Design of M2 Layer for Dynamic Tunability

FIGS. 6A-6C compare results for eight samples (structures are shown at the bottom of FIG. 6C) including HRS, LRS, on/off ratios (FIG. 6A); initial and stabilized HRS (FIG. 6B); and the device yield (FIG. 6C). Samples 1-7 had the same M1/M2 thickness (17 C or 1.9 nm) but with different numbers and stacking orders of ALD-$Al_2O_3$ and ALD-MgO layers grown on an Al electrode. Sample 8 had 8 C of ALD-$Al_2O_3$ on a ~1 nm thick Th—$AlO_x$ M2 layer (total M1/M2 thickness also ~1.9 nm). The architectures of these eight samples were selected to shed light on the role of $V_O$ doping by insertion of MgO atomic layers. Samples 1 and 2 used three MgO layers inserted in M1 but no M2 layer (i.e., an $Al_2O_3$ atomic layer forms the interface with the Al electrode); this means there were few $V_O$ present at the ohmic M/I interface for these samples. This explains the very low device yields of these two samples (FIG. 6C) and very low endurance (devices failed after the first few memristive switches), signifying that the $V_O$ provided in M1 through the insertion of 3 MgO layers was not sufficient to repeatedly form CFs and instead resulted in permanent dielectric breakdown for a large portion of the devices. The failure suggests that the $V_O$ provided in M2 is important for sustainable formation of CFs during memristive switches. This was further evidenced by the considerably improved device yield for Sample 3 that contained 1 MgO as the M2 layer but no MgO in M1. Samples 4-7 had MgO inserted in both M1 and M2 with improved device yield up to 100% for Samples 4, 5, and 7. This indicates that it is the combination of the $V_O$ doping in both M1 and M2 that enables the sustainable CF formation required for high-performance memristive switches. This also indicates that these intermittent ALD-MgO layers in the M1 layer can assist in the formation of CFs as a relay for transferring charge to ionize stabilized neutral $V_O$. Sample 8 had a similar structure to Sample 3 (with 1 MgO in M2) except with a ~1 nm thick Th—$AlO_x$ in M2. The much degraded memristor performance of Sample 8 was evidenced by reduced HRS, on/off ratio, and device yield (~80%), as compared to Sample 3, as well as compared to Samples 4-7. These results illustrate the critical importance in controlling unwanted defects in the M1/M2 stack so as to eliminate their negative impact on CF formation via atomic $V_O$ diffusion.

In addition, the results show that the location of the inserted MgO layers in the M1 stack can have subtle, but important effects on the memristor performance. For example, Sample 5 had its top-most MgO very close to the Schottky interface. This decreased the HRS and on/off ratio as compared to Sample 4, which exhibited the highest HRS and on/off ratio among the eight samples. This suggests that the Mg-doping in $Al_2O_3$ may reduce $V_{sch}$ due to the Fermi energy reduction and the corresponding shift of the $E_b$. On the other hand, inserting MgO layers in M1 directly on top of the M2 MgO layer, such as in Sample 6 (1 MgO in M1 on top of the M2 MgO layer) and Sample 7 (2 MgO in M1 on top of the M2 MgO layer), increased HRS and on/off ratio values for these samples as compared to Sample 5. This suggests that the additional MgO layers grown directly on the M2 MgO layer may increase the $V_O$ concentration in M1, making M1 less insulating. Interestingly, Samples 6 and 7 showed an $R_0$ value in the $10^4 \Omega$ range, but when forced to reset during the initial memristive switches, the HRS went up to the $10^5 \Omega$ range (FIG. 6B). This is in contrast to the nearly identical $R_0$ and HRS observed in Sample 4. Note that the other samples 1, 2, 3, 5, and 8 showed lower stabilized HRS after a few initial memristive switches, possibly due to dielectric breakdown (Sample 1 & 2), inadequate amount of $V_O$ in M1 to support sustainable memristive switches (Sample 3), reduction of the $V_{sch}$ (Sample 5), and presence of other defects originated from the Th—$AlO_x$ M2 (Sample 8). Therefore, the increase from lower $R_0$ to higher stabilized HRS indicates that for Samples 6 and 7, there may have been an excess of $V_O$ locally formed at the M1/M2 interface due to Mg-doping by the inserted MgO layers. Note that the increased resistance expected from Mg-doping in pristine $Al_2O_3$ as predicted from the DFT simulations of FIGS. 2A-2C may only occur partially before the localized $V_O$ are driven out of the M1/M2 interface by the electric field. This means that the number and location of MgO atomic layers in M1 allow for dynamically tuning the memristor parameters using an electric field. After the dynamic tuning, Samples 6 & 7 had on/off ratios increased by up to an order of magnitude with a device yield of 92% for Sample 6 and 100% for Sample 7.

CONCLUSION

In conclusion, atomic-scale controlled $V_O$ doping of ultra-thin pristine $Al_2O_3$ has been explored in this work by insertion of MgO atomic layers into $Al_2O_3$ atomic layer stacks grown using in vacuo ALD for atomically tunable memristors. Two effects of Mg doping in pristine $Al_2O_3$ are revealed by DFT calculations: reduction of the Fermi energy and hence, increase in resistivity, and increased generation of $V_O$. These are both desirable for high performance memristors. These two effects have been experimentally confirmed through a comparative study of memristor performance parameters with respect to the number and location of the inserted MgO atomic layers in the $MgO/Al_2O_3$ atomic layer stacks. Excitingly, this allows atomically tunable memristors to be achieved. Even using a M1/M2 thickness of just 1.2-2.4 nm, it was shown that the HRS can be tuned continuously over three orders of magnitude, leading to an on/off ratio tunable in the range of $10\text{-}10^4$ over this thickness range. Furthermore, dynamically tunable on/off ratio by up to one order of magnitude was obtained by arranging the MgO atomic layers at the M1/M2 interface. Finally, an exponentially decreasing tunneling conductance with increasing M1/M2 thickness demonstrates that tunneling is the dominant HRS conduction mechanism of these memristors. The tunnel barrier height $E_T=E_b+V_{sch}$ is determined by the M1/M2 barrier height $E_b$ and the Schottky barrier $V_{sch}$, meaning that the Schottky and tunnel barriers work in tandem to limit current. In vacuo STS dI/dV characterization has revealed that higher $E_b$ up to 1.45 eV can be obtained in less defective $Al_2O_3$/MgO M1/M2 grown on Al electrode with a negligible M/I interface, in contrast to much lower $E_b$ 0.75 eV when a defective native oxide IL is present. Nevertheless, the $V_{sch}$ of 1.19 eV can be maintained at the $Pd/Al_2O_3$ Schottky interface. The results demonstrate a new approach for design and fabrication of ultrathin memristors tunable at an atomic scale.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

If not already included, all numeric values of parameters in the present disclosure are proceeded by the term "about" which means approximately. This encompasses those variations inherent to the measurement of the relevant parameter as understood by those of ordinary skill in the art. This also encompasses the exact value of the disclosed numeric value and values that round to the disclosed numeric value.

Any directional language used in the present disclosure such as top, bottom, upper, lower, above, below, and the like is not necessarily intended to be limiting, but rather to provide a point of reference to other elements being described.

The foregoing description of illustrative embodiments of the disclosure has been presented for purposes of illustration and of description. It is not intended to be exhaustive or to limit the disclosure to the precise form disclosed, and modifications and variations are possible in light of the above teachings or may be acquired from practice of the disclosure. The embodiments were chosen and described in order to explain the principles of the disclosure and as practical applications of the disclosure to enable one skilled in the art to utilize the disclosure in various embodiments and with various modifications as suited to the particular use contemplated. It is intended that the scope of the disclosure be defined by the claims appended hereto and their equivalents.

What is claimed is:

1. A memristor comprising:
a bottom electrode;
a top electrode in electrical communication with the bottom electrode, wherein one or both of the bottom and top electrodes is a Schottky electrode; and
a dielectric stack between the bottom and top electrodes, the dielectric stack forming a top interface with a bottom surface of the top electrode and a bottom interface with a top surface of the bottom electrode, the dielectric stack comprising a plurality of atomic layer deposition (ALD)-grown atomic sublayers, the plurality comprising an ALD-grown atomic sublayer of a first metal oxide and an ALD-grown atomic sublayer of a second metal oxide, wherein the second metal oxide is different from the first metal oxide and has a greater concentration of oxygen vacancies ($V_O$) than the first metal oxide,
wherein the dielectric stack has a thickness of no more than about 5 nm.

2. The memristor of claim 1, wherein the first and second metal oxides are selected from aluminum oxide ($Al_2O_3$), gallium oxide ($Ga_2O_3$), magnesium oxide (MgO), calcium oxide (CaO), beryllium oxide (BeO), cadmium oxide (CdO), zinc oxide (ZnO), and hafnium oxide ($HfO_2$).

3. The memristor of claim 1, wherein the second metal oxide lowers a Fermi energy of the first metal oxide and lowers an oxygen vacancy ($V_O$) formation energy of the first metal oxide.

4. The memristor of claim 1, wherein the first metal oxide is $Al_2O_3$ or $Ga_2O_3$ and the second metal oxide is MgO.

5. The memristor of claim 1, wherein the bottom electrode is an Ohmic electrode and the top electrode is the Schottky electrode.

6. The memristor of claim 1, wherein the thickness of the dielectric stack is no more than about 3 nm.

7. The memristor of claim 1, wherein the ALD-grown atomic sublayer of the second metal oxide is positioned within the dielectric stack to form the bottom interface with the bottom electrode or to form the top interface with the top electrode.

8. The memristor of claim 7, wherein the ALD-grown atomic sublayer of the second metal oxide forms the bottom interface with the bottom electrode and the bottom electrode is an Ohmic electrode.

9. The memristor of claim 7, wherein the dielectric stack further comprises an additional ALD-grown atomic sublayer of the second metal oxide which is positioned within the dielectric stack directly in contact with the ALD-grown atomic sublayer of the second metal oxide.

10. The memristor of claim 7, wherein the dielectric stack further comprises an additional ALD grown atomic sublayer of the second metal oxide which is positioned within the dielectric stack directly in contact with and sandwiched between two ALD-grown atomic sublayers of the first metal oxide.

11. The memristor of claim 1, wherein the dielectric stack is characterized by an asymmetric distribution of its ALD-grown atomic sublayers of the first metal oxide and its ALD-grown atomic sublayers of the second metal oxide.

12. The memristor of claim 11, wherein all ALD-grown atomic sublayers of the second metal oxide are positioned within a subregion of the dielectric stack that is no more than 60% of the thickness of the dielectric stack.

13. The memristor of claim 12, wherein the subregion is positioned closer to one of the bottom and top electrodes than the other.

14. The memristor of claim 1, wherein conduction through the dielectric stack in a high resistance state of the memristor is via tunneling.

15. The memristor of claim 1, wherein the plurality further comprises an ALD-grown atomic sublayer of a third metal oxide, wherein the third metal oxide is different from the first and second metal oxides.

16. The memristor of claim 15, wherein the first metal oxide is $Al_2O_3$, the second metal oxide is MgO, and the third metal oxide is $Ga_2O_3$.

17. The memristor of claim 1, wherein the ALD-grown atomic sublayer of the second metal oxide is positioned within the dielectric stack to form the bottom interface with the bottom electrode or to form the top interface with the top electrode;

wherein the dielectric stack further comprises an additional ALD grown atomic sublayer of the second metal oxide which is positioned within the dielectric stack directly in contact with and sandwiched between two ALD-grown atomic sublayers of the first metal oxide; and wherein the dielectric stack is characterized by an asymmetric distribution of its ALD-grown atomic sublayers of the first metal oxide and its ALD-grown atomic sublayers of the second metal oxide.

18. The memristor of claim 17, wherein the ALD-grown atomic sublayer of the second metal oxide forms the bottom interface with the bottom electrode and the bottom electrode is an Ohmic electrode.

19. The memristor of claim 18, wherein the first metal oxide is $Al_2O_3$ or $Ga_2O_3$ and the second metal oxide is MgO.

20. The memristor of claim 17, wherein the plurality further comprises an ALD-grown atomic sublayer of a third metal oxide, wherein the third metal oxide is different from the first and second metal oxides.

* * * * *